US005914525A

United States Patent [19]

Yoshida et al.

[11] Patent Number: 5,914,525

[45] Date of Patent: Jun. 22, 1999

[54] SEMICONDUCTOR DEVICE

[75] Inventors: Minoru Yoshida; Yasuhiko Nishikubo, both of Yokohama, Japan

[73] Assignee: Innotech Corporation, Kanagawa-ken, Japan

[21] Appl. No.: 09/094,911

[22] Filed: Jun. 12, 1998

[30] Foreign Application Priority Data

Jun. 26, 1997 [JP] Japan .................................... 9-185959

[51] Int. Cl.[6] ..................................................... H01L 29/40

[52] U.S. Cl. .......................... 257/531; 336/200; 336/205; 336/208

[58] Field of Search .................................... 336/200, 225, 336/205, 208; 257/531

[56] References Cited

U.S. PATENT DOCUMENTS 5,157,576 10/1992 Takaya et al. .......................... 257/531

FOREIGN PATENT DOCUMENTS 4-186667 7/1992 Japan ..................................... 257/531

*Primary Examiner*—David B. Hardy
*Attorney, Agent, or Firm*—Steinberg & Raskin, P.C.

[57] ABSTRACT

A semiconductor device is disclosed, comprising an integrated circuit formed on an upper surface of a semiconductor wafer chip and inductance formed on sides of the semiconductor wafer chip.

3 Claims, 2 Drawing Sheets

SEMICONDUCTOR DEVICE

BACKGROUND OF THE INVENTION

1. Field of the Invention

The present invention relates to semiconductor devices and, more particularly, to a semiconductor device which is most suitable for realizing a microminiature functional electronic component used for portable telephones, personal digital assistants and the like.

2. Description of the Related Art

Recently, information apparatuses such as PHS's and PDA's (personal digital assistants) are widely used. There is a significant demand for the reduction of the size of such information apparatuses.

In order to satisfy such a demand for reduced sizes, efforts have been made to reduce the size of electronic circuit components as mush as possible.

For example, as a resonance circuit required for the transmission and reception of signals, as shown in FIG. 6, an integrated circuit 31 including capacitance is formed on an upper surface of a semiconductor device 3 constituted by a semiconductor wafer chip W3, and externally attached inductance, i.e., a coil 30, is connected to the integrated circuit 31.

However, the most significant factor that has hindered the reduction of size in configuring conventional compact communication apparatuses is the presence of a coil 30 as described above that is required for configuring a resonance circuit for transmission and reception of signals.

An electronic circuit and capacitance can be easily realized on the same surface of a semiconductor wafer chip. However, it is not a so preferable solution to form inductance on the same surface.

For example, as shown in FIG. 5, it is possible to form inductance 42 in the form of a planar coil on a wafer chip of a semiconductor device 4. However, an attempt to maintain a sufficient coil diameter and number of turns to increase the capacity of the inductance will result in an increase in the area on the wafer chip occupied by the inductance. The resultant need for increasing the surface area of the wafer chip also goes against the efforts toward compactness.

Since it is not so advantageous to form inductance on a surface of a wafer chip as described above, a coil 30 has been externally attached.

Such externally attached inductance is a significant factor that has hindered the realization of microminiature information apparatuses.

Further, the use of externally attached inductance has been a cause of cost increase also in point of the number of parts and the number of man-hour for assembly.

SUMMARY OF THE INVENTION

It is therefore an object of the present invention to eliminate the need for conventional externally attached inductance to realize a semiconductor device integrated with inductance, thereby allowing an electronic component utilizing inductance to be made compact.

It is another object to reduce the number of such constituent electronic components to achieve cost reduction.

A semiconductor device according to the first invention is characterized in that it comprises an integrated circuit formed on an upper surface of a semiconductor wafer chip and inductance formed on sides of the semiconductor wafer chip.

The second invention is based on the first invention and is characterized in that the inductance is connected to the integrated circuit to configure a resonance circuit.

The third invention is characterized in that the semiconductor wafer chip according to the first or second invention is in the form of a polygonal cylinder.

DETAILED DESCRIPTION OF THE INVENTION

Figure 1:
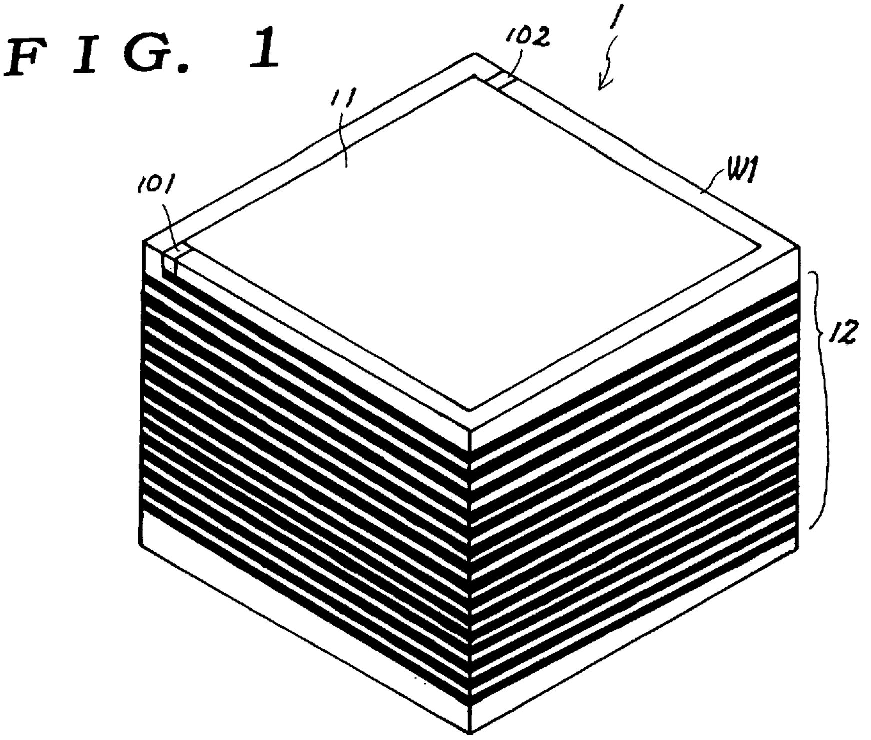
FIG. 1 is a schematic perspective view of a semiconductor device according to a first embodiment.
Figure 2:
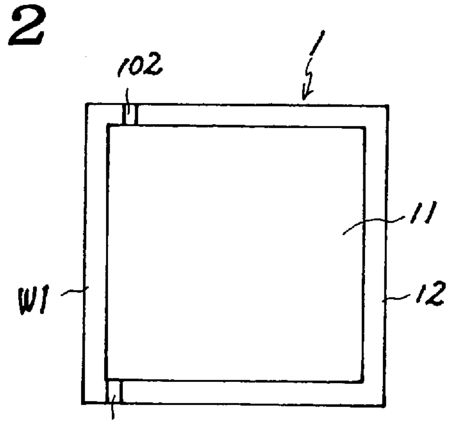
FIG. 2 is a schematic plan view of the semiconductor device according to the first embodiment.
Figure 3:
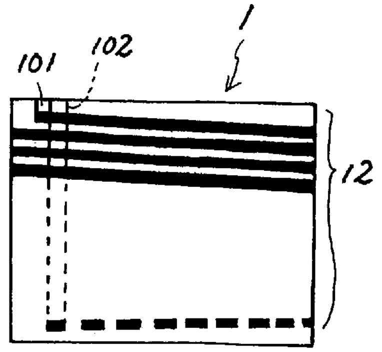
FIG. 3 is a schematic side view of the semiconductor device according to the first embodiment.

In a semiconductor device 1 according to a first embodiment shown in FIGS. 1–3 is formed with an integrated circuit 11 on a surface of a semiconductor wafer chip W1 and inductance 12 on outer sides of the semiconductor wafer chip W1. In such a semiconductor device 1, the integrated circuit 11 and inductance 12 are integrated through connection conductors 101, 102. The above-described wafer chip W1 is a quadrangular cylinder whose bottom is square.

FIG. 2 is a schematic view of the semiconductor device 1 in FIG. 2 as viewed from above, and FIG. 3 is a schematic view as viewed laterally. Further, in those figures, the area of a conductor forming the inductance 12 is represented by bold lines.

A description will now be made on an example of a method of manufacturing the semiconductor device 1 in FIG. 1.

First, the integrated circuit 11 of the semiconductor device 1 is manufactured on a semiconductor wafer using a conventional method of manufacturing an integrated circuit and is diced into individual wafer chips W1.

Thereafter, as shown in FIG. 1 and FIG. 3, inductance 12 is formed on the sides of the wafer chip W1 which is like a conductor wound in the form of a coil. The inductance 12 can be produced using a semiconductor manufacturing technique employing a metal vapor deposition apparatus such as PVD or CVD and a photoengraving technique. Obviously, the integrated circuit 11 must be masked during the formation of the inductance 12.

Then, the integrated circuit 11 and inductance 12 are connected through connection conductors 101, 102 to form the semiconductor device 1.

The description of manufacture is an example, and it is obvious that various methods of manufacture employing current known techniques are possible. For example, the inductance 12 is sufficiently available with transfer type printing. Further, it is needless to say that the connection conductors 101, 102 can be produced using a metal deposition apparatus or printing system simultaneously with the inductance 12.

The semiconductor device 1 having such a configuration can form a resonance circuit because the integrated circuit 11 and inductance 12 are connected through the connection conductors 101, 102, but it is not essential to connect the integrated circuit 11 and inductance 12 in advance. By forming a connection terminal of each of the integrated circuit 11 and inductance 12 externally to the semiconductor device 1, they can be externally connected to each other as needed and, for example, the inductance 12 can be connected to another device instead of connecting it to the integrated circuit 11.

Figure 5:
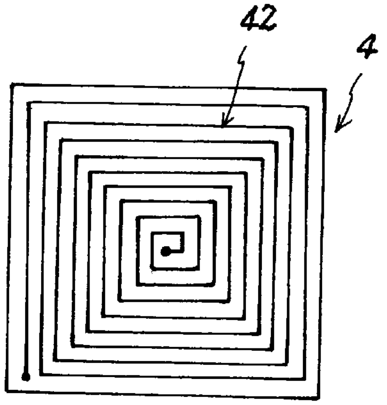
FIG. 5 is a schematic view of a semiconductor wafer formed with inductance on the bottom thereof as viewed from above.
Figure 6:
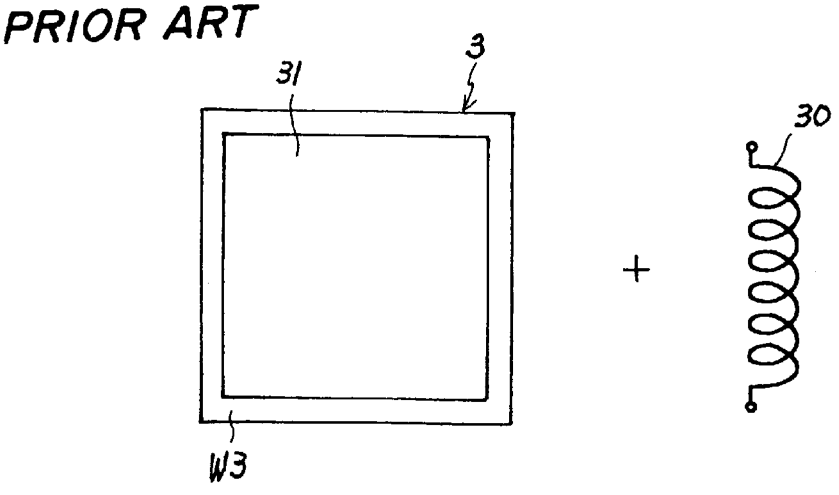
FIG. 6 PRIOR ART
FIG. 6 illustrates a configuration of a semiconductor device loaded with no inductance and externally attached inductance according an example of the related art.

Next, inductance capacities L for a case wherein it is produced on the outer sides of a chip like the inductance 12 of the first embodiment and a case wherein inductance 42 in the form of a planar coil is produced on a surface of a wafer chip like a semiconductor 4 shown in FIG. 5 are calculated through simulation and compared.

Conditions for the Simulation

Simulator: Electromagnetic field simulator Maxwell manufactured by AnSoft Corp., U.S.A.

Chip Thickness: 800 $\mu$m

Deposited Conductor: Copper (conductivity $=5.8\times10^7$mho/m)

Conductor Line & Space: 20 $\mu$m, 20 $\mu$m

Thickness of Deposited Conductor: 10 $\mu$m

Simulation (1) An inductance capacity L42 is calculated for a case wherein the inductance 42 in the form of a planar coil is formed on a surface of the semiconductor device 4 as shown in FIG. 5. The bottom of the semiconductor device is a square of 1 mm×1 mm.

Inductance capacity: L42$=6.89\times10^{-8}$H (2) An inductance capacity L12 is calculated for a case wherein the inductance 12 is formed on the entire outer sides of the semiconductor device 1 as shown in FIG. 1. The bottom of the semiconductor device is a square of 1 mm×1 mm.

Inductance capacity: L12$=3.86\times10^{-7}$H (3) An inductance capacity L12 is calculated for a case wherein the bottom of the semiconductor device is a square of 10 mm×10 mm and wherein the inductance 12 is formed on the entire outer sides as in FIG. 1.

Inductance capacity: L12$=1.02\times10^{-5}$H

Although the calculations used for the above-described simulation are omitted here because they are complicated, an inductance capacity increases with the number of turns and diameter of the coil.

The results of the above-described simulation (1) and (2) indicate that when inductance is formed on semiconductor devices of the same size, the inductance capacity L12 in the case (2) wherein it is formed on the sides is greater than the inductance capacity L42 in the case (1) wherein it is formed on a surface of the semiconductor device in a planar fashion.

In addition, the above-described simulation (1), i.e., the semiconductor device 4 in FIG. 5 includes only the inductance 42. In spite of the fact that the inductance 42 is formed at the sacrifice of the entire integrated circuit portion, it is less than the inductance capacity L12 of the inductance 12 in FIG. 1 formed on the outer sides of the wafer chip.

Further, the result of the simulation (3) indicates that an increase in the area of the bottom of the semiconductor device results in an increase in the inductance capacity L12. This is because of an increase in the coil diameter of the inductance 12.

If the inductance 42 is formed on the entire surface of the wafer chip of the semiconductor device 4 as shown in FIG. 5, the semiconductor device 4 becomes a semiconductor device having inductance only, which necessitates another integrated circuit provided separately. This is substantially the same as externally attached inductance and, therefore, this is not done in practice.

However, if inductance and an integrated circuit are integrated on the same surface even when the area of the bottom of the wafer chip is somewhat large, the area of the portion where the integrated circuit is to be formed is reduced because the inductance occupies a large area.

For example, the area of the side portion where the inductance 12 is formed under the conditions for the simulation (3) is 10 mm×800 $\mu$m×4. This area is equal to 30% of the area of the bottom of the wafer chip which is 10 mm×10 mm.

Therefore, when the inductance 42 in the form of a planar coil is formed on the bottom of the wafer chip using an area equivalent to the above-described area, the area where the integrated circuit is formed is reduced by 30%.

In addition, since the inductance 42 is in the form of a planar coil, it has a coil diameter which decreases toward the center thereof. In this case, it is possible to obtain only an inductance capacity which is smaller than the inductance 12 wound with the same diameter even through the same area is used. That is, although not precisely calculated, additional area is required to obtain an inductance capacity equivalent to the inductance 12.

Thus, it is not practical to sacrifice 30% or more of the area where the integrated circuit is to be formed.

Figure 4:
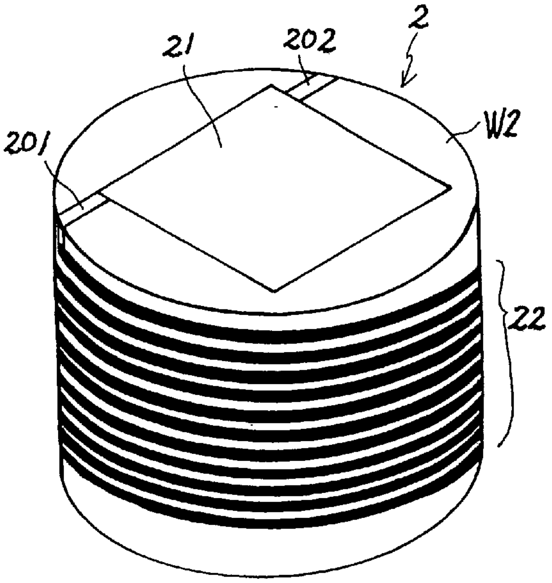
FIG. 4 is a schematic perspective view of a semiconductor device according to a second embodiment.

A second embodiment shown in FIG. 4 is a cylindrical semiconductor device 2. An integrated circuit 21 is formed on a surface of a wafer chip W2, and inductance 22 is formed on sides thereof. The integrated circuit 21 and inductance 22 are connected through connection conductors 201, 202.

The semiconductor device 2 functions similarly to the first embodiment.

In an semiconductor device according to the present invention configured like the first and second embodiments, an integrated circuit and inductance on a surface of the wafer chip can be integrated by producing the inductance utilizing outer sides of the wafer chip which have not been conventionally used.

In addition, this makes it possible to obtain a sufficient inductance capacity compared to a planar coil formed on a surface of a wafer chip without any overall size increase.

A semiconductor device integrated with inductance as described above which does not employ any externally attached inductance as required in the related art can be used for card type or wrist watch type microminiature information apparatuses which will become the main stream in the future.

Further, it may be used as an antenna chip.

While the semiconductor devices 1, 2 in the above-described first and second embodiments are in the forms of a quadrangular cylinder and a cylinder, any three-dimensional shape may be used as long as it has a bottom surface on which an integrated circuit is to be formed and sides on which inductance is to be formed. However, a polygonal cylinder such as quadrangular cylinder in the first embodiment is easy to dice than a cylinder as in the second embodiment. Further, it reduces unused areas on a wafer.

Although a quadrangular cylinder as in the first embodiment is especially easier to separate compared to other polygonal cylinders, other shapes may be used. By changing the shape of the surface of a wafer chip, the coil diameter can be also changed because the circumference is changed even though the surface area is kept equal.

As in the first embodiment, by configuring inductance on outer sides of a wafer chip which have not conventionally been used, it is possible to realize a microminiature semiconductor device which has inductance simultaneously with a high function integrated circuit allowing high utilization of a gate area achieved as in the related art.

The second invention makes it possible to obtain a microminiature semiconductor device having a resonance circuit.

Further, since those inventions make it possible to eliminate inductance which has been an external component, it is possible to achieve not only reduction of size but also cost reduction through reduction in the number of parts and the number of man-hour for assembly.

In addition, inductance produced on the side circumference of a wafer chip provides a greater inductance capacity compared to inductance formed on the same surface as an integrated circuit in a planar fashion.

Therefore, a semiconductor device according to the present invention can be applied to microminiature high performance functional electronic components such as card type or wrist watch type microminiature information apparatuses which will become the main stream in the future.

Furthermore, when a chip wafer is in the form of a polygonal cylinder as in the third invention, the production of the chip is facilitated and the waste of the wafer can be reduced.

What is claimed is:

1. A semiconductor device comprising an integrated circuit formed on an upper surface of a semiconductor wafer chip and inductance formed on sides of the semiconductor wafer chip.

2. The semiconductor device according to claim 1, wherein the inductance is connected to the integrated circuit to configure a resonance circuit.

3. The semiconductor device according to claim 1, wherein the semiconductor wafer chip is in the form of a polygonal cylinder.

* * * * *